US010619097B2

(12) United States Patent
Faur et al.

(10) Patent No.: US 10,619,097 B2
(45) Date of Patent: Apr. 14, 2020

(54) LOW-[HF] ROOM TEMPERATURE WET CHEMICAL GROWTH (RTWCG) CHEMICAL FORMULATION (71) Applicants: Horia M. Faur, Medina, OH (US); Maria Faur, North Olmsted, OH (US)

(72) Inventors: Horia M. Faur, Medina, OH (US); Maria Faur, North Olmsted, OH (US)

(73) Assignee: SPECMAT, Inc., North Olmsted, OH (US)

( * ) Notice: Subject to any disclaimer, the term of this patent is extended or adjusted under 35 U.S.C. 154(b) by 0 days.

(21) Appl. No.: 14/755,992

(22) Filed: Jun. 30, 2015

(65) Prior Publication Data

US 2015/0376498 A1   Dec. 31, 2015

Related U.S. Application Data (60) Provisional application No. 62/018,836, filed on Jun. 30, 2014.

(51) Int. Cl.
C09K 13/08 (2006.01)
H01L 21/02 (2006.01)
H01L 31/0216 (2014.01)

(52) U.S. Cl.
CPC ........ C09K 13/08 (2013.01); H01L 21/02238 (2013.01); H01L 31/02167 (2013.01); Y02E 10/50 (2013.01)

(58) Field of Classification Search
None
See application file for complete search history.

(56) References Cited

U.S. PATENT DOCUMENTS

| | | | |
|---|---|---|---|
| 3,013,956 A | 12/1961 | Hugle et al. | |
| 4,002,512 A | 1/1977 | Lim | |
| 4,578,419 A | 3/1986 | Hall | |
| 5,242,525 A | 9/1993 | Biagiotti | |
| 5,409,569 A | 4/1995 | Seki et al. | |
| 5,601,656 A | 2/1997 | Li | |
| 5,714,407 A | 2/1998 | Maeno et al. | |
| 5,726,077 A | 3/1998 | Kawahata et al. | |
| 6,080,683 A | 6/2000 | Faur et al. | |
| 6,504,134 B1* | 1/2003 | Sheu | H01L 21/67248 204/408 |
| 6,593,077 B2 | 7/2003 | Faur et al. | |
| 6,613,697 B1 | 9/2003 | Faur et al. | |
| 6,679,996 B1 | 1/2004 | Yao | |
| 6,783,695 B1 | 8/2004 | Torck et al. | |
| 7,250,114 B2* | 7/2007 | Kiehlbauch | C03C 15/00 134/3 |
| 7,442,652 B2 | 10/2008 | Aoki et al. | |
| 7,642,198 B2 | 1/2010 | Sato | |
| 8,043,525 B2* | 10/2011 | La | C03C 15/00 252/79.1 |
| 8,043,974 B2 | 10/2011 | Park et al. | |
| 8,318,606 B2 | 11/2012 | Baiocchi et al. | |
| 8,338,692 B2 | 12/2012 | Imazaki et al. | |
| 8,524,851 B2 | 9/2013 | Kim et al. | |
| 9,068,112 B2 | 6/2015 | Faur et al. | |
| 2002/0061563 A1* | 5/2002 | Stephens | G01N 33/82 435/102 |
| 2002/0125214 A1 | 9/2002 | Mirkin et al. | |
| 2003/0159362 A1 | 8/2003 | Singh et al. | |
| 2003/0227663 A1 | 12/2003 | Agrawal et al. | |
| 2004/0000268 A1 | 1/2004 | Wu et al. | |
| 2004/0224866 A1 | 11/2004 | Matsunaga et al. | |
| 2006/0121695 A1 | 6/2006 | Ueda et al. | |
| 2006/0213868 A1* | 9/2006 | Siddiqui | C09G 1/02 216/88 |
| 2007/0163618 A1 | 7/2007 | Kim et al. | |
| 2007/0218668 A1 | 9/2007 | Wagener | |
| 2008/0271780 A1 | 11/2008 | Narayanan et al. | |
| 2009/0192065 A1 | 7/2009 | Korzenski et al. | |
| 2010/0101453 A1 | 4/2010 | Tanaka et al. | |
| 2010/0112728 A1* | 5/2010 | Korzenski | H01L 21/02079 438/3 |
| 2011/0117751 A1* | 5/2011 | Sonthalia | C11D 1/62 438/753 |
| 2012/0088318 A1 | 4/2012 | Chang et al. | |
| 2012/0178257 A1 | 7/2012 | Sapra et al. | |
| 2012/0273458 A1 | 11/2012 | Bret et al. | |

(Continued)

FOREIGN PATENT DOCUMENTS

DE    268807 61        6/1989
JP    H08-264640 A    11/1996

(Continued)

OTHER PUBLICATIONS

L. Li et al., Surface Passivation and Microroughness of (100) Silicon Etched in Aqueous Hydrogen Halide (HF, HCI, HBr, HI) Solutions, J. Appl. Phys., vol. 77, No. 3, pp. 1323 to 1325, Feb. 1, 1995.

V. P. Ulin et al., Electrochemical Pore Formation Mechanism in III-V Crystals (Part I), Semiconductors, vol. 41, No. 7, pp. 832 to 844, Jul. 1, 2007.

Klugmann-Radziemska et al., Chemical Treatment of Crystalline Silicon Solar Cells as a Method of Recovering Pure Silicon from Photovoltaic Modules, Renewable Energy, vol. 35, No. 8, pp. 1751 to 1759, Aug. 2010.

ISA/US, International Search Report and Written Opinion prepared for PCT/US2014/041682, dated Dec. 3, 2014 for application related to co-pending U.S. Appl. No. 14/897,633.

Niitsu et al., "Solvent Extraction Equilibria of Acids. VII. The Co-extraction of Water with Strong Mineral Acids by Trioctylphosphine Oxine," Bulletin of the Chemical Society of Japan, vol. 52, No. 6, p. 1799-4801 (1979) pet 1800, col. 2, para 4.

(Continued)

Primary Examiner — Shamim Ahmed
(74) Attorney, Agent, or Firm — Joseph J. Crimaldi (57) ABSTRACT This present invention relates to a Room Temperature Wet Chemical Growth (RTWCG) formulations, methods and processes. In one embodiment, the present invention further relates to RTWCG formulations, methods and processes that utilize a low-[HF]. In another embodiment, the present invention relates to RTWCG formulations with improved bath life.

14 Claims, 4 Drawing Sheets (56) References Cited

U.S. PATENT DOCUMENTS

| | | |
|---|---|---|
| 2013/0186464 A1 | 7/2013 | Sheng et al. |
| 2013/0206229 A1 | 8/2013 | Watabe et al. |
| 2013/0247971 A1 | 9/2013 | Haas et al. |
| 2014/0061531 A1* | 3/2014 | Faur .................... H01L 31/068 252/79.3 |
| 2014/0264155 A1 | 9/2014 | Van Duren et al. |
| 2015/0162460 A1 | 6/2015 | Faur et al. |
| 2016/0122554 A1 | 5/2016 | Faur et al. |
| 2016/0233374 A1* | 8/2016 | Knight ............. H01L 31/02167 |

FOREIGN PATENT DOCUMENTS

| | | |
|---|---|---|
| JP | 2006-324507 | 11/2006 |
| WO | 2008157345 A2 | 12/2008 |
| WO | 2012036760 A1 | 3/2012 |
| WO | WO2012036760 A1 * | 3/2012 |

OTHER PUBLICATIONS

European Extended Search Report dated Jan. 23, 2017 for EP Application No. 148116221 for EP national phase application related to co-pending U.S. Appl. No. 14/897,633.

* cited by examiner

LOW-[HF] ROOM TEMPERATURE WET CHEMICAL GROWTH (RTWCG) CHEMICAL FORMULATION

RELATED APPLICATION DATA

This patent application is a non-provisional of and claims priority to U.S. Provisional Patent Application No. 62/018,836 filed Jun. 30, 2014 and titled "Low-[HF] Room Temperature Wet Chemical Growth (RTWCG) Chemical Formulation." The complete text of this application is hereby incorporated by reference as though fully set forth herein in its entirety.

FIELD OF INVENTION

This present invention relates to a Room Temperature Wet Chemical Growth (RTWCG) formulations, methods and processes. In one embodiment, the present invention further relates to RTWCG formulations, methods and processes that utilize a low-[HF]. In another embodiment, the present invention relates to RTWCG formulations with improved bath life.

BACKGROUND OF THE INVENTION

As is known to those of skill in the art, silicon dioxide ($SiO_2$) forms the basis of the planar technology. In industrial practice the dielectric coatings for electronic and photonic devices are most frequently formed by thermal oxidation of silicon (Si) in dry or wet oxygen ambient at temperatures ranging from 900° C. to 1200° C. $SiO_2$ can also be deposited by chemical vapor deposition (CVD) techniques at lower temperatures (200° C. to 900° C.) on various substrates.

Thermal and CVD-grown $SiO_2$ based layers are used as, for example, diffusion masks, to passivate device junctions, as electric insulation, as dielectric material in Si technology, and as capping layers for implantation-activation annealing in III-V compound semiconductor technology.

The growth of dielectric films at low temperatures is very attractive for most device applications due to reduced capital costs, improved output levels, as well as addressing some of the technological constraints associated with the growth of dielectric thin films using conventional high-temperature growth/deposition techniques. Thin dielectric film near room-temperature growth/deposition techniques are known in the art and are chiefly used for microelectronic/photonic (optoelectronic) device applications. An example of these low temperature methods are the physical vapor deposition processes which include: (i) nonreactive (conventional) or reactive resistive; (ii) induction or electron beam evaporation; (iii) reactive or nonreactive DC or RF magnetron; and (iv) ion-beam sputtering processes.

The room temperature growth of dielectric layers on semiconductor surfaces using anodic oxidation is also known. Such processes are able to grow $SiO_2$ layers on Si substrates that are up to 200 nm thick and typically consume about 0.43 of the oxide thickness from the underlying Si substrate. This in principle could be used to produce a first layer ARC in a multi-layer ARC structure that passivates the silicon surface. Etching back the so called dead layer of the emitter's surfaces (i.e., the emitter's surfaces not covered by metallization) would be a useful bonus for solar cells and other electronics and optoelectronics device applications.

The use of organometallic solutions to deposit $SiO_2$ dielectric layers is known in the art. The dielectric layer is applied either by dipping the substrate into the organometallic solution, by spraying the organometallic solution on the substrate, or by spinning the substrate after a small amount of the organometallic solution is applied thereto. After the organometallic solution is applied, it is necessary to drive off the solvent part of the solution by heating the substrate to about 400° C.

A large number of patents, patent applications, and published papers describe near room temperature related processes for the deposition of $SiO_2$ and $SiO_{2-x}F_x$ layers on various substrates, including silicon surfaces. The so called liquid-phase deposited (LPD) $SiO_2$ technique was initially proposed in 1950 by Thomsen et al. for depositing $SiO_2$ on the surface of soda lime silicate glass. LPD is based on the chemical reaction of $H_2SiF_6$ with water to form hydrofluoric acid and solid $SiO_2$. The $H_2SiF_6$ solution is initially saturated with $SiO_2$ powder (usually in a sol-gel from). Before immersing the glass into the solution a reagent that reacts with the hydrofluorosilicilic acid such as boric acid may be added to the solution to supersaturate with silica. As shown by Sang M. Han et al., the LPD process is a competition between the deposition and etching of $SiO_2$. Regardless of the small variations in formulations, the overall reversible chemical reaction is:

$$H_2SiF_6 + 2H_2O \leftrightarrow 6HF + SiO_2$$

One of the major disadvantages of the $SiO_2$ LPD method described above is a very low deposition rate. Using hydrofluorosilicilic acid, $SiO_{2-x}F_x$, deposition rates of 110 nm/hour were claimed by C. F. Yeh et al. The inventors of the present patent application have experimented with the LPD method and discovered that the LPD $SiO_2$ has relatively poor adhesion to the Si surfaces and the maximum growth rate obtained was in actuality less than about 25 nm/hour. Chien-Jung Huang used an optimized $SiO_2$ LPD on Si to show that the maximum $SiO_2$ growth rate on Si is 360 Angstroms/hour (i.e., 36 nm/hour).

High Growth Rate RTWCG SiOX Thin Film Dielectrics: U.S. Pat. Nos. 6,080,683; 6,593,077; and 6,613,697, as well as WO 2012/036760 describe in detail a fast SiOX growth technique using the so called Room Temperature Wet Chemical Growth (RTWCG) of SiOX based thin film dielectric layers on silicon (Si) substrates for a variety of electronics including, but not limited to, microelectronics and optoelectronics (photonics) applications. The above patents and/or published patent applications describe Room Temperature Wet Chemical Growth (RTWCG) methods and processes of SiOX thin film coatings which can be grown on various substrates. Suitable substrates include but are not restricted to Si, Ge, III-V, I-III-VI, and II-VI compound semiconductors. The RTWCG method and process is very well suited to grow thin films on the Si substrates used in the manufacture of silicon-based electronic and photonic (optoelectronic) device applications.

The term RTWCG process of SiOX dielectric layers, as used herein, means a room temperature (e.g., from about 10° C. to about 45° C.) wet chemical growth process of $Si_xO_yX_x$ layers where x is from 0.9 to 1.1, y is from 0.9 to 2, and x is from 0 to 1. Si stands for silicon, O stands for oxygen, and X is either fluorine (F), carbon (C), nitrogen (N) or a combination of these with iron (Fe), palladium (Pd), titanium (Ti), or other trace-level metallic and/or non-metallic contaminants depending on the growth system or non-invasive additives used. The trace level metallic and/or non-metallic elements include, but are not limited to, any one or more of the elements or elemental dopants known to those with skill in the semiconductor arts. Additionally, the term "SiOX" as utilized throughout this specification and claims is defined as detailed above with regard to the formula $Si_xO_yX_x$ and is defined components.

U.S. Pat. No. 6,080,683, entitled "Room Temperature Wet Chemical Growth Process of SiO Based Oxides on Silicon;" and U.S. Pat. No. 6,593,077 entitled "Method of Making Thin Films Dielectrics Using a Process for Room Temperature Wet Chemical Growth of SiO Based Oxides on a Substrate," both describe RTWCG SiOX methods and processes on a semiconductor substrate comprising: (a) providing a reaction mixture comprising of a silicon source, a pyridine compound, and an aqueous reduction oxidation solution; (b) additives to enhance the reaction; and (c) reacting the mixture with the substrate to form the silicon oxide layer.

High growth rate RTWCG SiOX thin films, as reveled in U.S. Pat. Nos. 6,080,683 and 6,593,077 were grown using the RTWCG process on silicon and other semiconductor substrates using commercial-grade 34 percent $H_2SiF_6$. Other liquid precursors included, but were not limited to, silicon sources such as $(NH_4)_2SiF_6$, aqueous compounds such as $K_3Fe(CN)_6$ and Fe-EDTA, and an electron transfer component such as N-(n-butyl)pyridinium chloride (n-BPCI). High growth-rate growth of SiOX oxide on silicon substrates was achieved by using commercial grade organic and inorganic silicon sources, a pyridine compound (i.e., N-(n-butyl)pyridinium chloride), redox aqueous solutions based on $Fe^{2+}/Fe^{3+}$, and non-invasive additives including NaF, KOH, $NH_4F$, and $HF_{(aq)}$. In one embodiment of the above inventions, the SiOX growth solution was made by mixing 2 to 5 volume parts 34 percent $H_2SiF_6$ with 2 to 5 volume parts 0.5 M $K_4Fe(CN)_{6(aq)}$, 1 to 3 parts 60 percent $H_2TiF_{6(aq)}$, and 0 to 4 volume parts 5 percent n-$BPCl_{(aq)}$. This solution was saturated with $SiO_2$-containing compounds such as silica, silica gel, and various other additives.

By using the above growth solution formulations, the SiOX oxide layers grown on various semiconductor substrates have a relatively low growth rate and a relatively high metallic and non-metallic impurity concentration. They have inferior electric and dielectric properties compared to the SiOX oxide layers grown using the growth solution formulations described by the U.S. Pat. No. 6,613,697, entitled "Low Metallic Impurity SiO Thin Film Dielectrics on Semiconductor Substrates." The RTWCG SiOX growth rate on Si surfaces described in the U.S. Pat. No. 6,613,697 ranges from 1 nm/minute to over 100 nm/minute depending on the composition of the growth solution.

In one embodiment of U.S. Pat. No. 6,613,697, all organic components of the growth solution were substituted with inorganic components. Only inorganic components were used for the silicon source and the pyridine-based compounds were eliminated. Various inorganic aqueous $Me^{+n}/Me^{+(n+m)}$ (were n is from 0 to 4 and m is from 1 to 4, inclusive) combinations of redox additives were added to the growth solution as per above. The RTWCG SiOX thin film layers grew on various semiconductor substrates at a higher growth rate and with lower metallic and non-metallic impurity concentration. Also there was an improvement in the dielectric properties of the resulting thin films when compared to the RTWCG SiOX thin films grown in solutions with organic components.

In one embodiment WO 2012/036760 discloses a RTWCG SiOX growth solution formulation that eliminates the need for a silicon source, such as $H_2SiF_6$ or any other silicon source found in the prior art RTWCG SiOX growth solution formulations. This embodiment requires HF concentrations ([HF]) to be from 10 percent by weight to 40 percent by weight.

In one embodiment WO 2014/200985 discloses a RTWCG SiOX growth solution which by including certain non-oxidizing acids such as hydrochloric acid (HCl) can utilize [HF] much lower than disclosed in related patents. Due to the drastic reduction of [HF] in solution, the formulations disclosed can be created as concentrated solutions which can be diluted on site. Dilutions of as much as 1 part concentrate to 26 parts water were successfully utilized in inline wet chemical benches.

Anti-Reflection Coatings Prior Art: Anti-reflection coatings (ARC) are included in a solar cell design to substantially reduce the amount of reflected light. Bare Si loses 42 percent of light with long wavelengths of 1.1 µm, 37 percent of light with wavelengths of 1 µm, and about 54 percent of light with short wavelengths of 0.4 µm. A textured front surface, such as regularly spaced pyramids or porous silicon (PS), can lower the AM 1.5 average weighted reflection to between 12 percent to 18 percent over the 0.4 µm to 1.2 µm wavelength range.

The optimal thickness of an anti-reflection coating is calculated by the following formula:

$$d_1 = \frac{\lambda_0}{4n_1}.$$

For a quarter wavelength ARC made of a transparent material having a refractive index $n_1$, and a light incident on the coating with a free-space wavelength $\lambda_0$, the thickness which causes minimum reflection is $d_1$. Because the index of refraction is wavelength-dependent, near zero reflection can only occur for a single wavelength. The refractive index and thickness of an ARC must minimize the reflection of light with wavelengths of 0.6 µm since this wavelength is close to the peak power of the solar spectrum. The equations for multiple anti-reflection coatings are more complicated than that for a single layer (see Wang et al.). By properly adjusting the refractive index and thickness of two layers it is theoretically possible to produce two minima and an overall reflectance as low as 3 percent.

A proper SLAR on smooth surfaces (e.g., Mg $F_2$, $SiO_2$, SiO, $SiN_x$, $TiO_2$ and $Ta_2O_5$) can reduce the AM 1.5 average weighted reflection (AWR) to a range between 12 percent to 16 percent over the 0.4 µm to 1.1 µm wavelength range. For an optimized CVD-deposited $SiN_x$ ARC, which is the norm for silicon solar cell ARC applications, the AM 1.5 AWR is about 12 percent with a simulated minimum AWR of 10.4 percent as calculated by Wright et al. on flat c-Si having an assumed film index of refraction, n, of 1.95, and thickness, d, of 81 nm.

Whether or not the simulated minimum $SiN_x$ SLAR AWR is achievable in a production environment remains to be seen. But even if the simulated reflectance is achieved, the reflective losses are still too high at 10.4 percent reflectivity. The industry would still need to create a practical low-cost way of further lowering the reflectance through a double layer ARC, a textured silicon solar cell surface, or both. However, this approach becomes cost prohibitive for most commercial solar cell applications.

For textured surfaces with well-designed single or double layer AR coatings such as ITO/$SiO_2$, ZnS/$MgF_2$, $TiO_2$/$MgF_2$, and $TiO_2$/$Al_2O_3$ the AM 1.5 AWR has been brought down to between 3 percent and 8 percent. A large number of studies on double layer ARCs have been reported. The most stable configuration with respect to variations in film thicknesses have been found to be designs with a high refractive index (n) on the substrate and a low refractive index towards the ambient (see Bauhaus et al.).

Both magnesium fluoride/zinc sulfide ($MgF_2$/ZnS) double layers deposited by electron beam sputtering (see Cid et al.) and titanium oxide ($TiO_2$) double layers deposited by Atmospheric Pressure Chemical Vapor Deposition (see Richards) show very low reflectance over a broad wavelength range. However, both techniques require a separate thermally-grown silicon oxide ($SiO_2$) layer for surface passivation. This essentially renders them a triple layer ARC with associated high costs and design flaws such as high absorption of near UV and blue light.

Two $TiO_2$ thin films were deposited on planar silicon wafers using atmospheric pressure chemical vapor deposition (APCVD) system under different deposition conditions. AWR values of 6.5 percent (measured) in air, and 7.0 percent (calculated) under glass were achieved for $TiO_2$ DLAR coatings (see Richards et al.).

Spin-coated $TiO_2$ single-layer, $SiO_2$/$TiO_2$ double-layer (DLAR), and $SiO_2$/$SiO_2$—$TiO_2$/$TiO_2$ triple-layer (TLAR) ARCs were deposited on smooth emitter Si solar cells [Lien et al] with average optical reflectance (from 400 nm to 1000 nm) around 9.3 percent, 6.2 percent and 3.2 percent, respectively. A 39 percent improvement in the efficiency of a c-Si solar cell was achieved with a TLAR ARC.

Jiao & Al claim a record photocurrent gain between 40 percent and 46 percent by using classical $TiO_2$/$SiO_2$ graded DLAR coating. According to Aiken, the complete elimination of reflection losses yields a maximum theoretical photocurrent gain after the ARC of approximately 53 percent.

A seven layer ARC design with graded-index AR coatings, measuring 60 to 160 nm thick, made of silicon dioxide ($SiO_2$) and titanium dioxide ($TiO_2$), was recently reported (see Kuo et al.). The bottom two layers are $TiO_2$, followed by three middle layers of co-sputtered $SiO_2$ and $TiO_2$. The top two layers consist of slanted nano-rods of $SiO_2$ with very low refractive indices of 1.22 and 1.09, the tilt angle of which is created using an oblique-angle deposition technique that precisely determines the refractive index. According to Kuo et al., the overall solar-to-electric efficiency improvement over bare silicon solar cells would be boosted from the 20.5 percent obtained with a quarter-wave coating to 42.7 percent.

Lipinski et al. reported the results of theoretical optical optimization of the graded index oxynitride ARC for silicon solar cells. Lipinski et al. used experimental optical data of $SiN_x$:H layers deposited by RF plasma enhanced chemical vapor deposition system. The highest improvement in short-circuit current (Jsc) of 44.6 percent was obtained with an $SiO_xN_y$ graded layer for $SiN_x$:H with a low refractive index (2.1 at 600 nm) and abrupt concentration profile which is characteristic of a DLAR $SiO_2$—$SiN_x$:H.

Layers of Stacked Dielectrics: A stacked dielectric is created by growing or depositing two or more distinct materials on top of one another. The materials most commonly utilized in the PV industry include silicon dioxide ($SiO_2$), hydrogenated amorphous silicon nitride (a-$SiN_x$:H), aluminum oxide ($Al_2O_3$), titanium oxide ($TiO_2$), and silicon oxynitride ($SiO_xN_y$). Stacked dielectrics are most commonly used in order to suppress reflection or for surface passivation. Layers such as a-$SiN_x$:H, $SiO_2$, or $Al_2O_3$ can reduce surface recombination if deposited or grown directly on the surface (first layer)—a significant loss mechanism in solar cells. For high efficiency crystalline silicon solar cell applications, thin film $SiO_2$ and $Al_2O_3$ layers are used for front and back surface passivation and as the first layer antireflection coating (ARC) in a multi-layer ARC structure. $SiO_xN_y$ or $SiN_x$ of low refractive index can be grown on top of $SiN_x$ layers of high refractive index to improve the transmission of light into the active parts of the cell.

SUMMARY OF THE INVENTION

This present invention relates to a Room Temperature Wet Chemical Growth (RTWCG) formulations, methods and processes. In one embodiment, the present invention further relates to RTWCG formulations, methods and processes that utilize a low-[HF]. In another embodiment, the present invention relates to RTWCG formulations with improved bath life.

This disclosure relates to a Room Temperature Wet Chemical Growth (RTWCG) method and process of SiOX thin film coatings which can be grown on various substrates. The invention further relates to RTWCG method and process suited to grow thin films on the Si substrates used in the manufacture of silicon-based electronic and photonic (optoelectronic) device applications. The invention further relates to processes used to produce SiOX thin film passivation layers for use as low reflectance single layer antireflection coatings (SLARC) and selective emitters (SE).

In one embodiment, the present invention relates generally to the field of semiconductors and/or semiconductor structures (e.g., solar cells, etc.), to chemical compositions for manufacturing such semiconductors and/or semiconductor structures, and/or to methods for manufacturing such semiconductors and/or semiconductor structures. In another embodiment, the present invention relates to chemical compositions and methods for controlling surface passivation, silicon etchback, reflective, and other properties of semiconductor surfaces used for various semiconductor applications including, but not limited to, solar cells.

One formulation of the present invention include the following various components given in weight percentages (w/w): from about 0.01 percent by weight to about 0.4 percent by weight of one or more iodine-containing compounds selected from $HIO_3$, $I_2O_5$, HI, KI, $BI_3$, $I_2O_4$, $I_2O_5$, $I_2O_9$, ICl, $SiI_4$, $IF_5$, $SiI_4$, $PI_3$, $P2I_4$, $TiI_4$, $VI_3$, $CoI_2$, $NiI_2$, $AsI_3$, $SnI_4$, $SbI_3$, $TeI_4$, $PbI_2$, and $BiI_3$, or mixtures of two or more thereof; from about 0.1 percent by weight to about 15 percent by weight of one or more fluoride-containing acids selected from HF, $H_2SiF_6$, $NH_4F$, $H_2TiF_6$, BaF, $BF_4$, NaF, one or more other metal fluorides, or mixtures of any two or more thereof; from about 1 percent by weight to about 50 percent by weight of one or more non-oxidizing acids selected from HCl, HI, HBr, HF, $H_3PO_4$, or mixtures of two or more thereof; from about 0.1 percent by weight to about 10 percent by weight of one or more pyridine compounds selected from pyridine-2,6-dicarboxylic acid, 2-hydroxypyridine, 3-hydroxypyridine, 4-hydroxypyridine, 2,4-dihydroxypyridine, 3-bromo-5-hydroxypyridine, and 2-hydroxypyridine 1-oxide, or mixtures of two or more thereof; with the remainder of this formulation being water. Another formulation of the present invention include the following various components given in weight percentages (w/w): from about 0.1 percent by weight to about 0.16 percent by weight $HIO_3$; from about 4 percent by weight to about 10 percent by weight HF; from about 10 percent by weight to about 30 percent by weight HCl; and from about 0.01 percent by weight to about 1.5 percent by weight 2,4-dihydroxypyridine, with the remainder of this formulation being water.

In the embodiments detailed above (and more fully discussed below), although the total amount of each component of the compounds of the present invention may individually total more than 100 weight percent when each component is taken individually and totaled using the broadest amounts disclosed herein, one of skill in the art will realize that this is not the case.

Thus, in one embodiment, the present invention relates to a low-[HF] composition and/or formulation comprising: (i) from about 0.01 percent by weight to about 0.4 percent by weight of at least one iodine-containing compound; (ii) from about 0.1 percent by weight to about 15 percent by weight of at least one fluoride-containing acid; (iii) from about 1 percent by weight to about 50 percent by weight of at least one non-oxidizing acid; and (iv) from about 0.1 percent by weight to about 10 percent by weight of at least one pyridine compound, wherein the at least one pyridine compound contains at least one —OH substituent group, wherein the remaining percent by weight of the low-[HF] composition and/or formulation is water so as to yield a 100 weight percent composition and/or formulation.

In another embodiment, the present invention relates to a low-[HF] composition and/or formulation comprising: (a) from about 0.1 percent by weight to about 0.16 percent by weight $HIO_3$; (b) from about 4 percent by weight to about 10 percent by weight HF; (c) from about 10 percent by weight to about 30 percent by weight HCl; and (d) from about 0.01 percent by weight to about 1.5 percent by weight 2,4-dihydroxypyridine, wherein the remaining percent by weight of the low-[HF] composition and/or formulation is water so as to yield a 100 weight percent composition and/or formulation.

In still another embodiment, the present invention relates to a method for creating at least one passivation layer, the method comprising the steps of: (A) supplying at least one silicon substrate; and (B) subjecting the at least one silicon substrate to a room temperature wet chemical growth process using a low-[HF] composition and/or formulation so as to accomplish: (B1) etchback of the at least one silicon substrate; or (B2) both etchback of the at least one silicon substrate and formation of at least one passivation layer, where etchback occurs concomitantly to the formation of the at least one passivation layer, the low-[HF] composition and/or formulation comprising: (i) from about 0.01 percent by weight to about 0.4 percent by weight of at least one iodine-containing compound; (ii) from about 0.1 percent by weight to about 15 percent by weight of at least one fluoride-containing acid; (iii) from about 1 percent by weight to about 50 percent by weight of at least one non-oxidizing acid; and (iv) from about 0.1 percent by weight to about 10 percent by weight of at least one pyridine compound, wherein the at least one pyridine compound contains at least one —OH substituent group, wherein the remaining percent by weight of the low-[HF] composition and/or formulation is water so as to yield a 100 weight percent composition and/or formulation.

DETAILED DESCRIPTION OF THE INVENTION

This present invention relates to a Room Temperature Wet Chemical Growth (RTWCG) formulations, methods and processes. In one embodiment, the present invention further relates to RTWCG formulations, methods and processes that utilize a low-[HF]. In another embodiment, the present invention relates to RTWCG formulations with improved bath life.

As a non-limiting example, the set of chemicals is a liquid composition that includes A percent by weight of one or more iodine-containing compounds; B percent by weight of one or more fluoride-containing acids; C percent by weight of one or more non-oxidizing acids; D percent by weight of one or more pyridine compounds; and E percent by weight water (to form the balance to 100 percent), where A ranges from about 0.01 percent by weight to about 0.4 percent by weight, B ranges from about 0.1 percent by weight to about 15 percent by weight, C ranges from about 1 percent by weight to about 50 percent by weight, D ranges from about 0.01 percent by weight to about 1.5 percent by weight, and the remaining percent by weight to 100 percent being water. In one example, A is 0.1317±0.1 percent by weight; B is 5.70±2.5 percent by weight; C is 25±12 percent by weight; D is 1.2±1 percent by weight, where the remaining percent by weight is E (water). The iodine-containing compound comprises one or more of $HIO_3$, $I_2O_5$, HI, KI, $BI_3$, $I_2O_4$, $I_2O_5$, $I_2O_9$, ICl, $SiI_4$, $IF_5$, $SiI_4$, $PI_3$, $P2I_4$, $TiI_4$, $VI_3$, $CoI_2$, $NiI_2$, $AsI_3$, $SnI_4$, $SbI_3$, $TeI_4$, $PbI_2$, and $BiI_3$.

The fluoride-containing acid comprises one or more of HF, $H_2SiF_6$, $NH_4F$, $H_2TiF_6$, BaF, $BF_4$, NaF, and other metal and non-metal fluorides. The non-oxidizing acid comprises one or more of HCl, HI, HBr, HF, $H_3PO_4$, and other acids that do not act as an oxidizing agent. The non-oxidizing acid associates with and helps to stabilize the iodine-containing compound, or its intermediary or other compound formed by the iodine-containing compound in solution. In one embodiment, the formulations of the present invention are directed to compositions that comprise a ratio of B to C of about 4:1 to about 1:10. In another embodiment, the ratio is 1:4.3860±2.5. In one embodiment, the formulations and/or compositions of the present invention comprise $HIO_3$ in an amount of about 0.02 to about 0.8 grams/liter. In another embodiment, the amount of $HIO_3$ is 0.5 grams/liter±0.15.

The pyridine containing compound comprises of one or more of pyridine-2,6-dicarboxylic acid, 2-hydroxypyridine, 3-hydroxypyridine, 4-hydroxypyridine, 2,4-dihydroxypyridine, 3-bromo-5-hydroxypyridine, and 2-hydroxypyridine 1-oxide. The pyridine compound associates with the iodine in solution and in effect arrests the oxidation state of the iodine. This preserves the solution's clear color while the solution is utilized to etchback the substrate to grow the SiOX thin film and improves the bath life of the solution.

In one embodiment, the formulations and/or compositions according to the present invention can be substantially free of silicon. By "substantially free of" it is meant that the liquid composition contains less than about 7.5 percent by weight or by volume silicon, less than about 5 percent by weight or by volume silicon, less than about 4 percent by weight or by volume silicon, less than about 3 percent by weight or by volume silicon, less than about 2.5 percent by weight or by volume silicon, less than about 2 percent by weight or by volume silicon, less than about 1.5 percent by weight or by volume silicon, less than about 1 percent by weight or by volume silicon, less than about 0.5 percent by weight or by volume silicon, less than about 0.25 percent by weight or by volume silicon, less than about 0.1 percent by weight or by volume silicon, less than about 0.05 percent by weight or by volume silicon, less than about 0.01 percent by weight or by volume silicon, less than about 0.001 percent by weight or by volume silicon, less than about 0.0001 percent by weight or by volume silicon, or even no (or zero) percent by weight or by volume silicon. Here, as well as elsewhere in the specification and claims, individual range values can be combined to form additional and/or non-disclosed ranges.

The concentrated growth solution can be said to comprise such formula even if, upon mixing the components according to these percentages, they react in solution to form one or more other intermediaries or compounds. In some cases, the sum of A, B, C, and D is approximately 100. The sum can be said to equal approximately 100 even if the solution contains small amounts of other components which were not intentionally added to the solution. As a non-limiting example, the concentrated growth solution of the present invention comprises, in one embodiment, 0.1317 percent by weight $HIO_3$, 5.70 percent by weight HF, 25.00 percent by weight HCl, and 69.1683 percent by weight $H_2O$. This solution will be referred to hereinafter as a "concentrated growth solution."

A diluted mixture according to one embodiment of the present invention comprises concentrated growth solution and water, wherein the mixture has a dilution ratio (composition:water) of about 1:4 to about 1:26. The novel oxide can be grown by exposing a portion of a surface to the liquid composition. For example, a SiOX layer can be grown on a surface that includes silicon.

Determination of Solution Consumption: SiOX growth solutions consume diffused silicon (Si) substrates to create the SiOX layer. As the solution is employed, its color has been observed to change in succession starting from light yellow, to dark yellow, to orange, and finally to pink. It is theorized that the growth solution's color changes due to a change in the oxidation state of the iodine species. For growth formulations blended using low HF concentrations ([HF] less than about 9 percent by weight), this change in color is concomitant to lower growth and etchback rates.

Formulations containing high HF concentrations ([HF] higher than about 9 percent by weight) also change in color from yellow to orange and finally to pink as they grow SiOX layers on diffused silicon substrates. Unlike the low-[HF] formulations, the high-[HF] formulations' etchback ability does not noticeably diminish due to the presumed change in oxidation of the iodine species utilized. But, although the etchback and SiOX growth rates of high-[HF] formulations do not necessarily diminish due to the supposed oxidation state changes of the iodine species in solution, the etchback and growth rates do nonetheless eventually lower.

The consumption tests described herein were run on growth solutions by fully immersing both faces of diffused Czochralski (CZ) wafers, sized approximately 2 cm by 3 cm and in certain tests sized approximately 3 cm by 5 cm, in 7 mL of growth solution until the solution's etchback rate slowed significantly. Sheet resistivity was measured before and after oxidation using a four-point probe and a sheet rho delta was calculated by subtracting the sheet rho of the sample before oxidation from the sheet rho of the same sample after oxidation (delta=$rho_{Oxidized}$-$rho_{starting}$). The etchback rate was assumed to be proportional to the oxide growth rate and a change in the etchback rate implied a change in SiOX growth rate, as such, all consumption tests were normalized to 10 ohm/sq delta. The 10 ohm/sq-normalized consumption rate (mL of concentrated solution/face) was calculated by running enough of the small are wafers through a dilution of concentrated growth solution until the solution's etchback rate was lowered and resulted in at least a 2 ohm/sq smaller delta.

The various blends described herein can be diluted in a tool to satisfy the etchback/oxide thickness needs of the user as well as the limitations of the tool being utilized, such as especially the degree of agitation; the agitation within the tool employed can range from essentially no agitation, as would be the case of a batch tool, to a large degree of agitation, as would be the case in a single-sided inline tool. As such, since in the case of batch tools with low agitation the dilution might be only about 1 part concentrated growth solution to about 5 parts water while in the case of inline tools it might be as dilute as about 1 part concentrated growth solution to about 26 parts water, the study was correlated to the concentrated growth solution even though the dilution in all studies was 1 part concentrated growth solution to 5 parts water; so all consumption data is given in mL of concentrated solution/face.

By knowing that the weight of a typical 180 micron CZ wafer is approximately 10 grams, and by weighing the combined samples which were oxidized in the 7 mL of solution to elicit the lower etchback rate, the consumption rate was calculated using the following method:

(Delta $Rho_{(average)}$/10 ohm/sq)×((7 mL/(weight of samples/10 grams full wafer)/2 faces).

The consumption rate units are given per face because in most cases, and especially for solar applications, the growth of the SiOX oxide will occur on only one face of the wafer (single-sided process). Diffused CZ wafers containing a symmetrical PSG on both faces were utilized in all tests.

Figure 1:
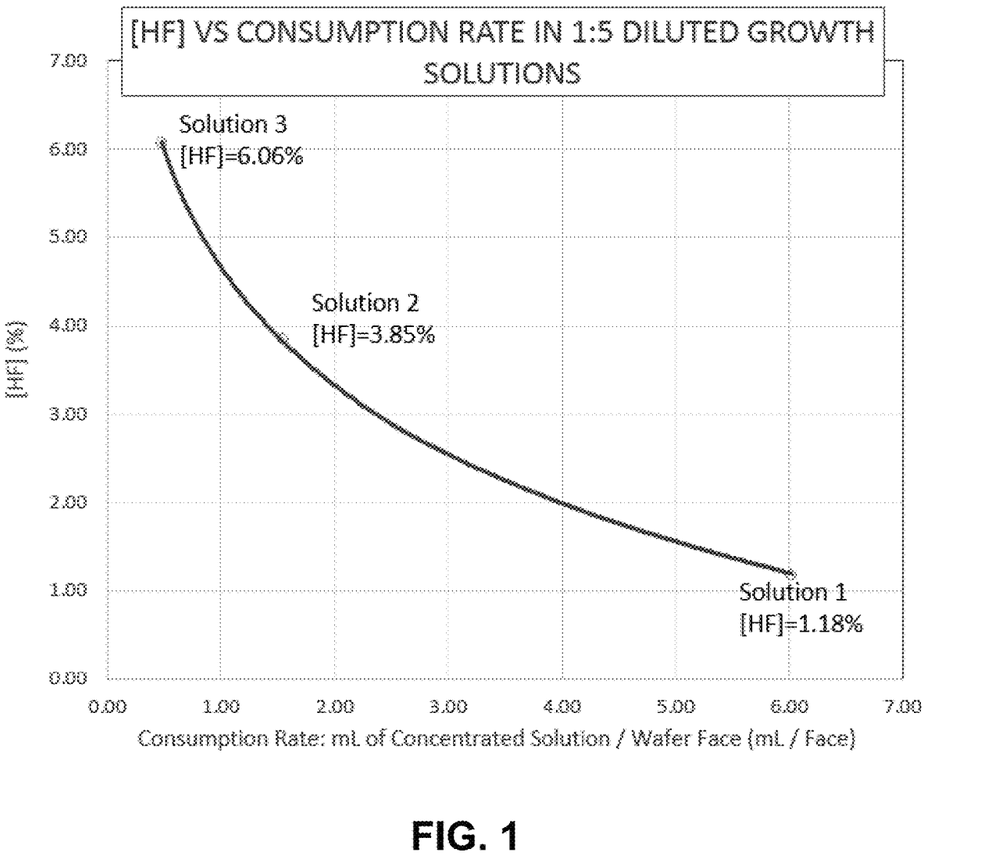
FIG. 1 is a graph that illustrates that the consumption rate of RTWCG solutions is lowered by increasing [HF]

Formulations that Lower Consumption Rates: The SiOX growth solution's rate of consumption falls as the HF concentration increases. FIG. 1 shows a graph of consumption as it relates to the concentration of HF used in formulating the growth solution. Solution 1 was formulated using the following weight percentages: 4.27 percent by weight HCl, 1.18 percent by weight HF, 0.226 percent by weight $HIO_3$, and 94.52 percent by weight water. Solution 2 was formulated using the following weight percentages: 4.26 percent by weight HCl, 3.85 percent by weight HF, 0.0225 percent by weight $HIO_3$, and 91.87 percent by weight water. Solution 3 was formulated using the following weight percentages: 2.46 percent by weight HCl, 6.06 percent by weight HF, 0.0289 percent by weight $HIO_3$, and 91.45 percent by weight water. As is readily evident from the graph in FIG. 1, the rate at which the growth solution is consumed falls with increasing HF concentration.

A change in color was observed in all of the low-[HF] formulations after a number of small area CZ wafers were oxidized. Solution 1 and Solution 2 showed a nearly 50 percent lowering in the sheet rho delta after the solution turned from light yellow to dark yellow in color. Solution 3 which contained the largest concentration of HF first turned dark yellow and finally orange in color before the sheet rho delta was cut in half.

The HF concentration-dependent trend of FIG. 1 was further explored on growth solutions which were formulated utilizing high HF concentrations. As can be seen in Table 1, the utilization of high [HF] formulations, which in these two examples excluded the HCl additive, did not result in a great deal of consumption lowering over Solutions 2 and 3 of FIG. 1. The change in color of the high [HF] formulations, and the presumed change in the oxidation state of the iodine species, is not the primary mechanism of consumption as can be seen in Table 2 where the changes in solution color were not concomitant to etchback lowering.

TABLE 1

| SOLUTION | FORMULATION | [HF] IN SOLUTION AS USED | CONSUMPTION ADJUSTED FOR ETCHBACK OF 10 OHM/SQ |
|---|---|---|---|
| 1 | 7 mL of 1 part [1.5 g HIO3/1 L 48% HF]: 5 parts water | 9.1 | 1.58 mL of concentrated blend/face |
| 2 | 7 mL of 1 part [1.5 g HIO3/1 L 48% HF]: 5 parts 48% HF | 48.0 | 1.10 mL of concentrated blend/face |

TABLE 2

| [HF] = 9% | | | [HF] = 48% | | |
|---|---|---|---|---|---|
| Small Area CZ Sample Number | Sheet Rho Delta (ohm/sq.) | Solution Color | Small Area CZ Sample Number | Sheet Rho Delta (ohm/sq.) | Solution Color |
| 1 | 24.2 | light yellow | 1 | 27.3 | light yellow |
| 2 | 21.1 | orange | 2 | 24.6 | dark yellow |
| 3 | 22.1 | orange | 3 | 29.4 | orange |
| 4 | 23.4 | pink | 4 | 25.5 | pink |
| 5 | 23.1 | pink | 5 | 26.1 | pink |
| 6 | 17.4 | pink | 6 | 25.5 | pink |
| | | | 7 | 26 | pink |
| | | | 8 | 19.8 | pink |

Figure 2:
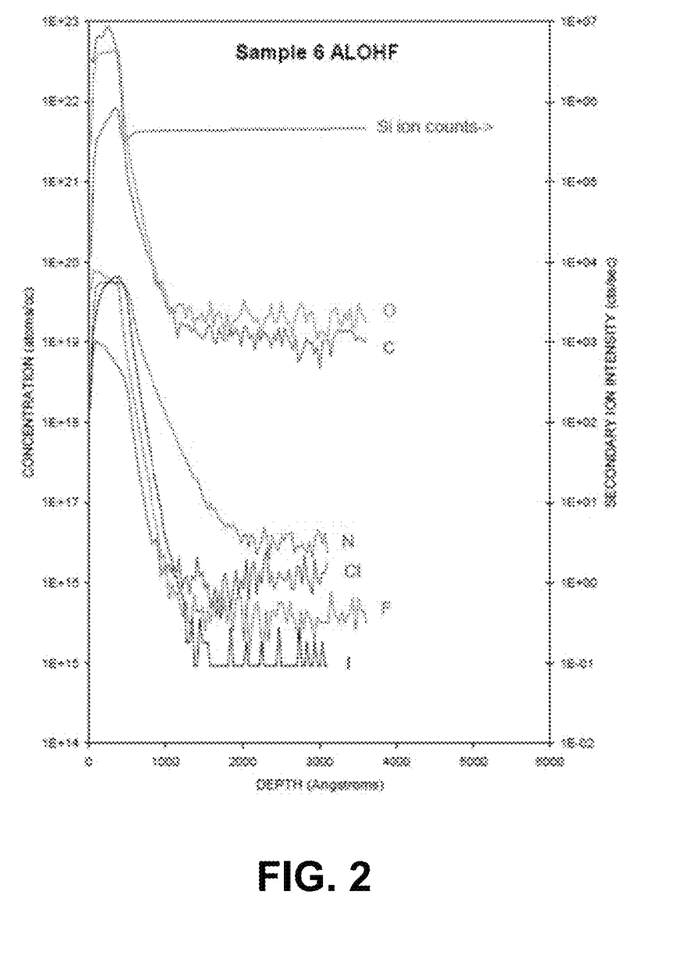
FIG. 2 is a Depth XPS profile showing that iodine is incorporated into the growing SiOX layer.
Figure 3:
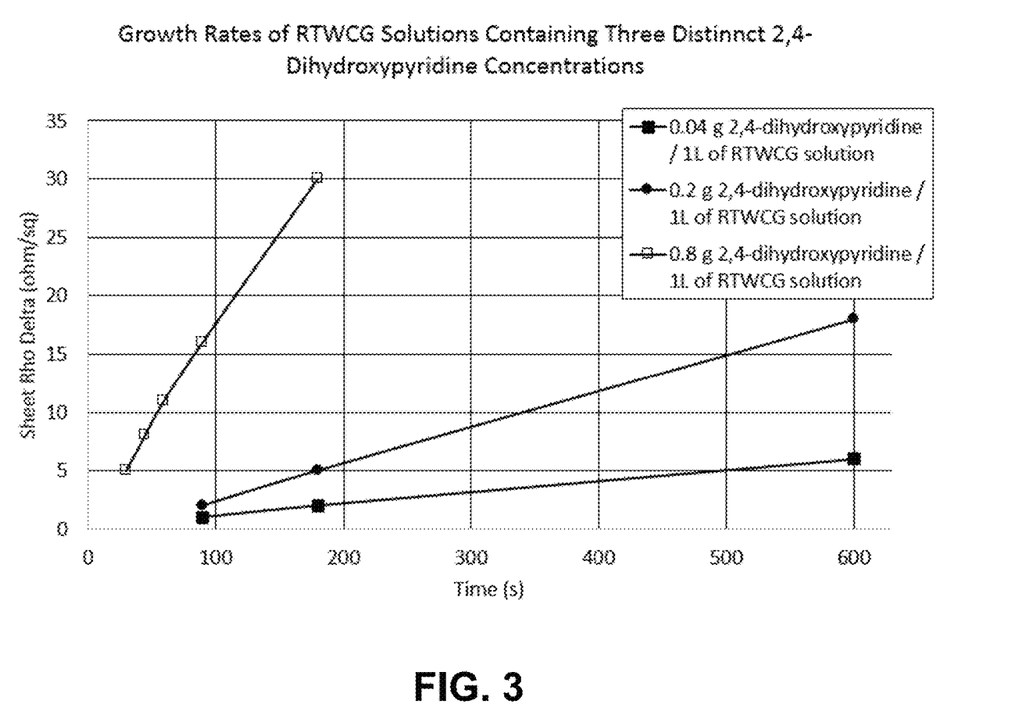
FIG. 3 is a graph that illustrates that the growth rate of the RTWCG solutions is lowered as the concentration of 2,4-dihydroxypyridine in solution increases.

As can be seen in Table 2, the mechanism involved in lowering the SiOX growth solution's efficacy, which for the purposes herein, can be called consumption, do not simply involve a change in the oxidation state of the iodine species in solution. One theory is that there is a depletion mechanism, such as through the deposition or assimilation of the iodine species onto or into the growing SiOX layer. This theory is supported by the SIMS depth profile in FIG. 2 that shows the incorporation of iodine in an oxide grown in a high-[HF] formulation. The deposition or incorporation of iodine species into the growing SiOX layer could diminish the concentration of the iodine species in solution. Another possible mechanism could be the formation and subsequent exhaustion of volatile iodine species such as, for example, $I_2$.

In one embodiment, concentrated growth solutions containing 2,4-dihydroxypyridine are able to maintain the "as-blended" light-yellow color. Although these solutions did not change in color throughout the consumption test, the solution was nonetheless consumed. Since it was visually evident that the iodine species did not change in oxidation state, the solution's consumption may be explained by a depletion of the iodine species either through the iodine species integration into the growing oxide or formation of volatile compounds.

Figure 4:
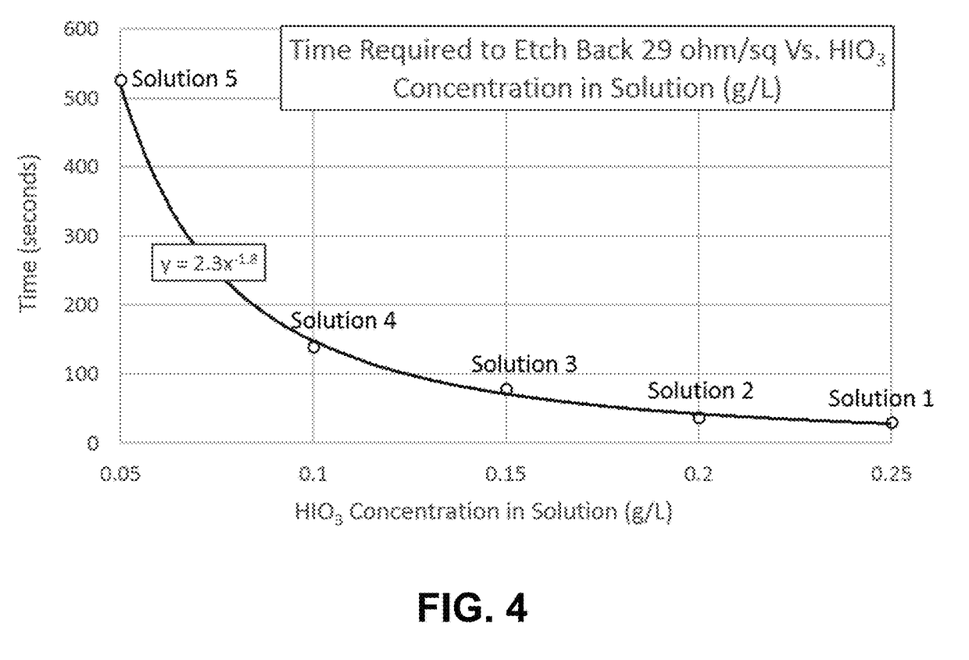
FIG. 4 is a graph illustrating the relationship between $[HIO_3]$ and the time required to etchback 29 ohm/sq.

The graph in FIG. 4 shows that the growth rate of SiOX is lowered with increasing 2,4-dihydroxypyridine concentrations in the growth solution. For this tests, solutions were created by first diluting 1 part concentrated growth solution with 5 parts water and then in one mixture the equivalent of 0.04 grams of 2,4-dihydroxypyridine was added per liter of growth solution, in the second mixture 0.2 grams of 2,4-dihydroxypyridine was added per liter of growth solution, and in the third mixture 0.8 grams of 2,4-dihydroxypyridine was added to the growth solution. A consumption test, as has already been described, was run on the three solutions as can be seen in Table 3.

TABLE 3

| Concentration of 2,4-dihydroxypyridine in Solution (g/L) | Consumption (mL of concentrated growth solution/face) | Sheet Rho Delta (ohm/sq) |
|---|---|---|
| 0.000 | 4.8 | 10 |
| 0.040 | 2.6 | 10 |
| 0.200 | 1.7 | 10 |
| 0.800 | 1.1 | 10 |

The graph in FIG. 4 shows the results of a test which attempted to further explore the possibility of a depletion component of consumption. In this test, five solutions of varying $HIO_3$ concentrations were utilized. Solution 1 had 0.250 grams $HIO_3$ dissolved in 1 liter of solution, Solution 2 had 0.2 grams $HIO_3$ dissolved in 1 liter of solution, Solution 3 had 0.150 grams $HIO_3$ dissolved in 1 liter of solution, Solution 4 had 0.1 grams $HIO_3$ dissolved in solution, and Solution 5 had 0.05 grams $HIO_3$ dissolved in solution. Five small-area 2 cm by 3 cm were oxidized in Solution 1 for 30 seconds which etched back the group by an average of 29 ohm/sq. 29 ohm/sq was thus the target etchback for the remaining solutions (2 through 5) and a graph was generated (FIG. 4) of the time required to reach the target etchback for each of the solutions. The etchback tests were conducted in still baths utilizing 2 cm by 3 cm CZ small-area samples which were cleaved from sister wafers that were textured and diffused together. The wafers contained a PSG layer.

As can be seen in FIG. 4, the time required to etchback 29 ohm/sq increased with the decreasing $HIO_3$ concentrations. An equation was generated which relates $[HIO_3]$ to the time required to etchback 29 ohm/sq: $y=2.3x^{-1.8}$, y is time in seconds and x is $[HIO_3]$ in grams/liter. In a different set of tests, $y=2.3x^{-1.8}$ was used to successfully predict how much $HIO_3$ to add in order to replenish solutions which had been exhausted. Table 4 shows one such test where small-area wafers were oxidized until the growth solution's etchback rate changed significantly. The time required to etchback 29 ohm/sq was determined for the exhausted solutions and were plugged into the function generated in FIG. 2 to determine the [$HIO_3$]. The missing $HIO_3$ was replenished, yielding a replenished solution with a replenished etchback rate.

A Sinton Instruments R&D wafer-lifetime tool was utilized to measure the minority carrier lifetime and the implied open-circuit voltage (I-Voc) of samples containing SiOX films grown in a growth solution formulated by adding 1 part

TABLE 4

| Trial | Sheet Rho Target (ohm/sq) | $T_0$ (sec) | $T_E$ (sec) | Solution Color at $T_E$ | [$HIO_3$] at $T_0$ (g/L) | Predicated [$HIO_3$] at $T_E$ (g/L) | $HIO_3$ Replenishment (g/L) | $T_R$ (sec) |
|---|---|---|---|---|---|---|---|---|
| 1 | 29 | 30 | 1020 | pink | 0.250 | 0.0344 | 0.216 | 30 |
| 2 | 29 | 30 | 102 | dark yellow | 0.250 | 0.127 | 0.123 | 30 |

As can be seen in Table 4, at full potency, before the solutions were exhausted, the growth solutions of Trials 1 and 2 required 30 seconds to etchback 29 ohm/sq ($T_0$). Both solutions were created by adding 1 part preferred concentrate to 5 parts water; the preferred concentrate contained the following weight percentages: 24.14 percent by weight HCl, 21.81 percent by weight HF, 0.128 percent by weight $HIO_3$, and 53.92 percent by weight water. After the growth solutions were exhausted, the times required to etchback 29 ohm/sq ($T_E$) was determined for each trial. In Trial 1 $T_E$ was 1020 seconds or 34 times greater than $T_0$, and the $T_E$ of Trial 2 was 102 seconds or 3.4 times greater than $T_0$. By knowing the original $HIO_3$ concentration in solution, and by using the equation $y=2.3x^{-1.8}$, described above, to estimate the $HIO_3$ in solution, the amount of $HIO_3$ required to replenishing the solutions was calculated to be 0.216 grams/liter and 0.1230 grams/liter for the solutions in Trials 1 and 2, respectively. After replenishing the appropriate amounts of $HIO_3$, the time required to etchback 29 ohm/sq was determined in both trials ($T_R$). After replenishing the missing $HIO_3$, it was concluded that the growth solutions' diminished etchback rates was overcome, as can be seen in Table 4 where $T_R=T_0=30$ seconds for both trials.

Maintaining the Color of the Growth Solution: The SiOX growth solutions change in color from light yellow, to dark yellow, to orange, and to pink as the solution is utilized to grow the SiOX layer on diffused Si substrates. One theory explaining this effect is that the iodine species' oxidation state is changed as a consequence of growing the SiOX layers. Another possible explanation for the color change is that a byproduct of oxidizing silicon substrates is the formation of triiodide ions which can turn the solution from light yellow to increasingly red in color depending on the triiodide concentration.

The addition of at least 2 grams of 2,4-dihydroxypyridine per 1 liter of concentrate, maintains the original color of the solution. The resulting SiOX films, when grown in growth solutions containing 2,4-dihydroxypyridine create films of similar passivation qualities as growth solutions which do not contain the additive.

preferred solution to 5 parts water into which was dissolved the equivalent of 0.5 grams 2,4-dihydroxypyridine per liter of solution. Table 5 contains the lifetime and I-Voc data which was collected from four CZ samples on which approximately 10 nm of SiOX was grown utilizing the aforementioned solution. The wafers were exposed to thermal budgets commonly utilized in solar cell fabrication. The thermal budgets were applied utilizing a Nabertherm P300 benchtop oven and consisted of a spin-dryer budget of 100° C. for 15 minutes, a PECVD budget of 400° C. for 5 minutes, and an estimation of metal firing conditions: 500° C. for 20 seconds, 800° C. for 5 seconds, and 900° C. for 5 seconds. The average growth in lifetime after all of the nominal thermal budgets were applied to the four samples was 53.58 µs, from 34.01 µs for the bare wafer to 87.59 µs for the SiOX samples after the thermal treatments; I-Voc values are also shown.

TABLE 5

| # | BARE CZ WAFER | | SiOZ AS GROWN | | DRYING (100° C., 15 min) | | PECVD (400° C., 5 min) | | FIRING 1 (500° C., 20 s) | | FIRING 2 (800° C., 5 s) | | FIRING 3 (900° C., 5 s) | |
|---|---|---|---|---|---|---|---|---|---|---|---|---|---|---|
| | Voc (mV) | LT (µs) | Voc (mV) | LT (µs) | Voc (mV) | LT (µs) | Voc (mV) | LT (µs) | Voc (mV) | LT (µs) | Voc (mV) | LT (µs) | Voc (mV) | LT (µs) |
| 1 | 591 | 31.11 | 594 | 35.85 | 598 | 40.57 | 615 | 74.16 | 612 | 65.16 | 616 | 76.11 | 622 | 94.82 |
| 2 | 595 | 35.39 | 594 | 34.92 | 597 | 39.77 | 614 | 70.5 | 611 | 64.09 | 615 | 72.15 | 621 | 88.98 |
| 3 | 594 | 34.46 | 596 | 38.22 | 600 | 44.27 | 615 | 73.23 | 613 | 70.08 | 616 | 73.16 | 620 | 91.98 |
| 4 | 595 | 35.08 | 594 | 35.53 | 598 | 40.01 | 611 | 62 | 611 | 63.39 | 612 | 65.45 | 616 | 74.57 |
| AVE | 594 | 34.01 | 595 | 36.13 | 598 | 41.16 | 614 | 69.97 | 612 | 65.68 | 615 | 71.72 | 620 | 87.59 |

While in accordance with the patent statutes the best mode and certain embodiments of the invention have been set forth, the scope of the invention is not limited thereto, but rather by the scope of the attached. As such, other variants within the spirit and scope of this invention are possible and will present themselves to those skilled in the art.

What is claim is:

1. A composition and/or formulation for room temperature wet chemical growth (RTWCG) of an oxide film, or layer, the composition and/or formulation comprising:
   from about 0.01 percent by weight to about 0.4 percent by weight of Component A, where Component A is selected from one or more iodine-containing compounds;
   (ii) from about 0.1 percent by weight to about 8.2 percent by weight of Component B, where Component B is selected from one or more of HF or $NH_4F$;
   (iii) from about 13 percent by weight to about 37 percent by weight of Component C, where Component C is selected from one or more non-oxidizing acids of HCl or HBr; and (iv) from about 0.01 percent by weight to about 10 percent by weight of Component D, where Component D is selected from one or more pyridine compounds, wherein the one or more pyridine compounds contain at least one —OH substituent group, wherein the remaining percent by weight of the composition and/or formulation containing Components A, B, C and D is water so as to yield a 100 percent by weight composition and/or formulation, and wherein the composition and/or formulation achieves the growth of a SiOX film, or layer, on a silicon substrate.

2. The composition and/or formulation of claim 1, wherein the one or more iodine-containing compounds are selected from $HIO_3$, HI, $I_2O_4$, $I_2O_5$, $I_2O_9$, or any combination of two or more thereof.

3. The composition and/or formulation of claim 1, wherein Component B is a combination of both HF and $NH_4F$.

4. The composition and/or formulation of claim 1, wherein Component B is HF.

5. The composition and/or formulation of claim 1, wherein Component C is HCl.

6. The composition and/or formulation of claim 1, wherein Component C is HBr.

7. The composition and/or formulation of claim 1, wherein Component C is a combination of HCl and HBr.

8. The composition and/or formulation of claim 1, wherein Component D is selected from one or more of pyridine-2,6-dicarboxylic acid, 2-hydroxypyridine, 3-hydroxypyridine, 4-hydroxypyridine, 2,4-dihydroxypyridine, 3-bromo-5-hydroxypyridine, and 2-hydroxypyridine 1-oxide, or mixtures of two or more thereof.

9. The composition and/or formulation of claim 1, wherein Component D is 2,4-dihydroxypyridine.

10. A composition and/or formulation for room temperature wet chemical growth (RTWCG) of an oxide film, or layer, containing a low concentration of HF, the composition and/or formulation comprising:

(a) from about 0.01 percent by weight to about 0.4 percent by weight of Component A, where Component A is $HIO_3$;

(b) from about 3.2 percent by weight to about 8.2 percent by weight of Component B, where Component B is HF;

(c) from about 13 percent by weight to about 37 percent by weight of Component C, where Component C is selected from one or more non-oxidizing acids of HCl or HBr; and (d) from about 0.01 percent by weight to about 2.2 percent by weight of Component D, where Component D is 2,4-dihydroxypyridine, wherein the remaining percent by weight of the composition and/or formulation containing Components A, B, C and D is water so as to yield a 100 percent by weight composition and/or formulation, and wherein the composition and/or formulation achieves the growth of a SiOX film, or layer, on a silicon substrate.

11. The composition and/or formulation of claim 10, wherein Component C is HCl.

12. The composition and/or formulation of claim 10, wherein Component C is HBr.

13. The composition and/or formulation of claim 10, wherein Component C is a combination of HCl and HBr.

14. A composition and/or formulation for room temperature wet chemical growth (RTWCG) of a passivation film, or layer, containing a low concentration of HF, the composition and/or formulation comprising:

from about 0.01 percent by weight to about 0.4 percent by weight of Component A, where Component A is $HIO_3$;

from about 3.2 percent by weight to about 8.2 percent by weight of Component B, where Component B is HF;

from about 13 percent by weight to about 37 percent by weight of Component C, where Component C is HCl; and from about 0.01 percent by weight to about 2.2 percent by weight of Component D, where Component D is 2,4-dihydroxypyridine, wherein the remaining percent by weight of the composition and/or formulation containing Components A, B, C and D is water so as to yield a 100 percent by weight composition and/or formulation, and wherein the composition and/or formulation achieves the growth of a SiOX-based passivation oxide film, or layer, on a silicon substrate.

* * * * *